United States Patent [19]

Berlincourt

[11] Patent Number: 4,489,274
[45] Date of Patent: Dec. 18, 1984

[54] ROTATING SQUID MAGNETOMETERS AND GRADIOMETERS

[75] Inventor: Ted G. Berlincourt, McLean, Va.

[73] Assignee: The United States of America as represented by the Secretary of the Navy, Washington, D.C.

[21] Appl. No.: 214,839

[22] Filed: Dec. 10, 1980

[51] Int. Cl.$^3$ .................................................. G01R 33/02
[52] U.S. Cl. ........................................ 324/248; 324/257
[58] Field of Search ................. 324/248, 247, 257, 346

[56] References Cited

U.S. PATENT DOCUMENTS

| | | | |
|---|---|---|---|
| 2,716,730 | 8/1955 | Williams | 324/257 |
| 3,397,586 | 8/1968 | Crook | 324/262 |
| 3,924,176 | 12/1975 | Fletcher et al. | 324/43 R |
| 4,013,946 | 3/1977 | Lewis | 324/43 R |
| 4,225,818 | 9/1980 | Gallop et al. | 324/302 |
| 4,349,781 | 9/1982 | Vozoff | 324/346 |

Primary Examiner—Gerard R. Strecker
Assistant Examiner—Walter E. Snow

[57] ABSTRACT

A method and apparatus for measuring the strength, direction and gradients of an unknown magnetic field, through the use of rotating superconducting quantum interference devices (SQUID). The apparatus utilizes SQUID magnetometers, off-diagonal SQUID gradiometers and diagonal SQUID gradiometers mounted upon a rotatable and translatable element to a plurality of positions in space. The instantaneous outputs of a plurality of SQUID devices are electronically analyzed to provide the magnetic field and gradient measurements.

16 Claims, 17 Drawing Figures

FIG. 10
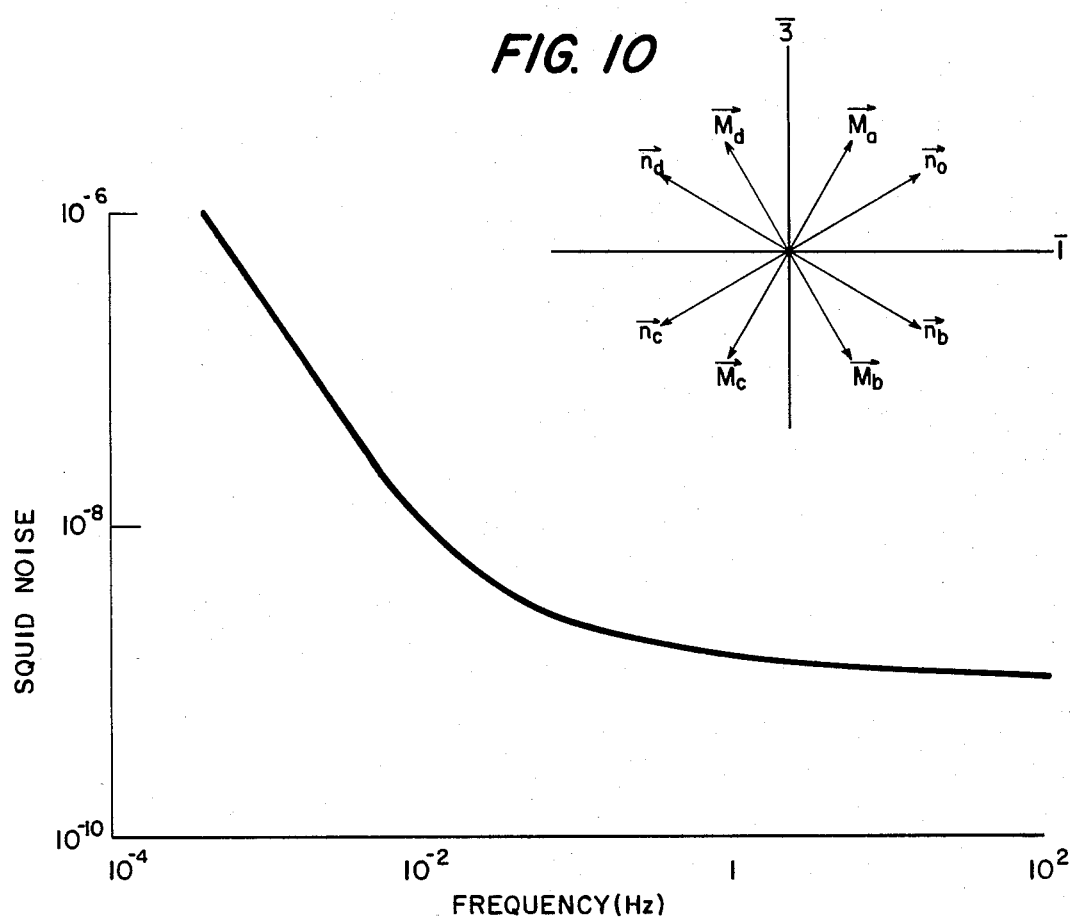
FIG. 11
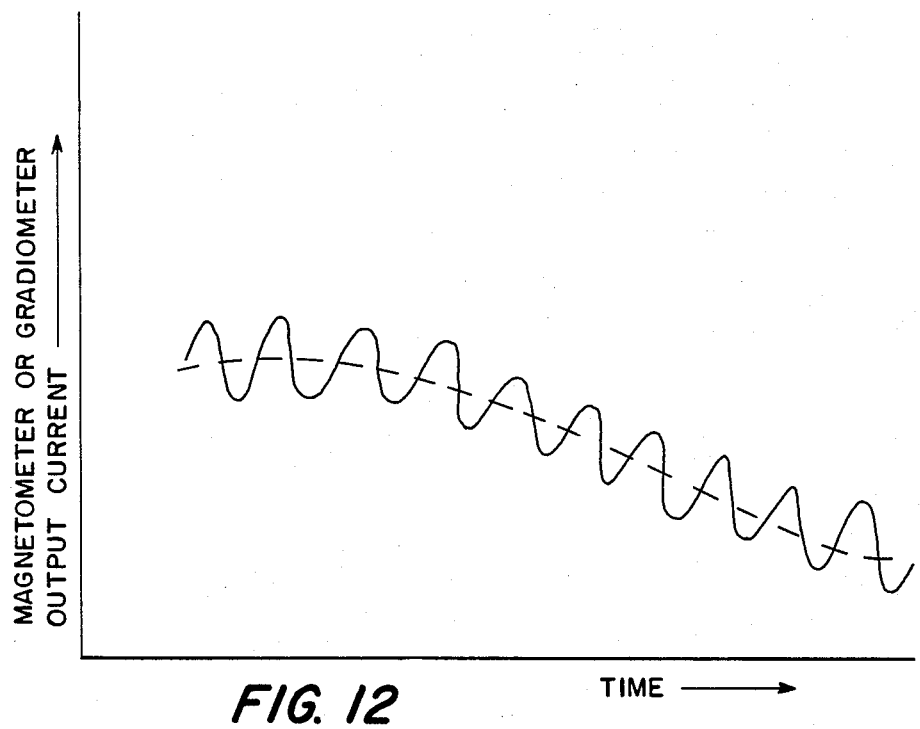
FIG. 12

ROTATING SQUID MAGNETOMETERS AND GRADIOMETERS

BACKGROUND OF THE INVENTION

The present invention relates to superconducting quantum interference devices, hereinafter referred to as SQUID's, and more particularly to SQUID type magnetometer and gradiometer arrays for measuring components of a magnetic field vector and components of the magnetic field gradient tensor.

The SQUID is a circuit device which is designed to be operated at extremely low temperatures. The SQUID utilizes materials which, when refrigerated to temperatures typically 4 to 10 degrees above absolute zero temperature, become superconducting and exhibit zero resistance. At such low temperatures and below a critical magnetic field strength, a superconductor establishes currents in a thin surface layer which excludes the applied magnetic field from all but a thin surface layer of the superconductor's interior. This magnetic flux exclusion is known as the Meissner effect, and it is a property which is useful in the design and development of magnetometers.

When using SQUID's as sensors for measuring various quantities, such as magnetic field and magnetic field gradients, two superconductors are separated by a very thin insulator to form a structure commonly known as a Josephson junction. A small "supercurrent" can be made to flow across the "insulated" gap between the two films with zero resistance and no voltage, just as if it were a single piece of superconductor. This flow of current is a case of quantum mechanical tunneling of superconducting electron pairs through the insulator giving rise to what is known as Josephson tunneling. Other superconducting junction device configurations may be used in the SQUID in place of the above-described "insulated" junction. For example, the two superconductors may be separated by a thin semiconductor, or by a thin normal metal, or by a very narrow superconducting bridge.

If the tunneling current in a Josephson junction exceeds a critical value, a voltage will appear across the junction and electromagnetic radiation will be emitted. This phenomenon is called the AC-Josephson effect. When the Josephson-junction device is incorporated in a superconductive loop, the most sensitive gauge known for measuring magnetism is created. As the strength of ambient magnetic field changes, the rf impedance of the circuit also changes. By measuring changes in this impedance, the strength of the magnetic field can be determined. This effect is produced by quantum mechanical interference between electrons traveling around the loop, such effect giving rise to the acronym "SQUID".

In the field of cryogenic magnetometry, it has been the general practice to employ SQUID magnetometers to measure components of a magnetic field. Likewise, SQUID gradiometers are typically used to measure a magnetic field gradient (i.e., the spatial variation of the field) by measuring simultaneously several spatial derivatives of a magnetic field. This characterizes the magnetic environment and provides data for calculation of the range, bearing and magnetic moment of any magnetic irregularity to the extent that it can be described as a magnetic dipole. Complete magnetic field vector data and complete gradient tensor data may also allow determination of range and bearing for magnetic irregularities which are more complex than simple dipoles. In any event, the present invention will facilitate magnetic surveys both for man-made objects and interesting geological and natural resource features.

In current practice, if it is desired to measure more than one component of the magnetic field vector, additional SQUID magnetometers must be used, i.e., each magnetometer detects only one vector field component. Similarly, a separate SQUID gradiometer is required to measure each independent element of the gradient tensor. Typically, a plurality of magnetometers and gradiometers are used to measure and characterize a magnetic field. For example, in IEEE Transaction of Magnetics, Volume MAG-II, Number 2, pages 701–707, March 1975, a system is described which utilizes three stationary SQUID magnetometers and five stationary SQUID gradiometers to determine all three vector field components and the five independent elements of the gradient tensor. The construction and operation of such an extensive array of magnetometers and gradiometers is very complex, time consuming, and difficult in part due to the precise requirements of balancing the gradiometer loops. Specifically, in order to assure reliable results with gradiometers, it is necessary to balance accurately the effective areas of the opposing sensing loops, as well as to obtain an exact angular relationship between them. Any variation from alignment and identical areas results in "sense loop imbalance" which gives rise to a sense loop signal proportional to field fluctuations and leads to an increased noise level. Each gradiometer constitutes a potential independent source of magnetic noise which can interfere with the signals generated by the SQUID sensors. The greater the number of gradiometers used in an array, the more difficult the balancing task becomes. A commonly used balancing technique makes use of small superconducting vanes which may be positioned so as to vary the distribution of magnetic flux intercepted by the gradiometer loops.

SUMMARY OF THE INVENTION

Accordingly, the present invention provides for a plurality of SQUID magnetometers and gradiometers having sensing loops fixedly mounted to a non-electrically conductive rotating element. Signals related to the magnetic field vector and to the magnetic field gradient tensor are transmitted from the loops along wires to signal coils. The signal coils are inductively coupled to SQUID's having Josephson-junctions, the SQUID's also being inductively coupled to pickoff coils which deliver the signals to processing electronics. Processing electronics decipher the signals to provide measurements of magnetic field components. Except for the processing electronics all of the foregoing components are situated within a cryogenic Dewar chamber.

OBJECTS OF THE INVENTION

Accordingly, it is a primary object of the present invention to measure components of a magnetic field and/or of a magnetic field gradient tensor by employing rotating SQUID magnetometers and/or gradiometers.

It is another object of the present invention to reduce substantially the number of SQUID magnetic field detectors and SQUID magnetic field gradient detectors required for a given measurement task.

It is a further object of the present invention to reduce the number and the difficulty of SQUID gradiometer balance adjustments required for a given task.

It is yet another object of the present invention to provide an improved system for detection of magnetic fields and magnetic field gradients associated with magnetic masses.

It is yet a further object of the present invention to provide a magnetic field and magnetic field gradient detection device having an improved signal-to-noise ratio.

It is a still further object of the present invention to provide a SQUID magnetic detection device having increased sensitivity to magnetic fields and magnetic field gradients.

It is yet still another object of the present invention to measure magnetic fields and magnetic field gradients over a narrow frequency band.

Further objects and the many attendant advantages of the invention may be best understood by reference to the following detailed description taken in conjunction with the accompanying drawings in which like reference symbols designate like parts throughout the figures thereof.

BRIEF DESCRIPTION OF THE DRAWINGS

FIG. 10 is a diagram of the solutions obtained by resolving the measured signals of the present invention; and FIG. 11 is a graph of the noise power spectrum of a SQUID device.

FIG. 12 shows the oscillating signal from a rotating magnetometer or gradiometer superimposed on low frequency background noise.

DESCRIPTION OF THE PREFERRED EMBODIMENT

Figure 1A:
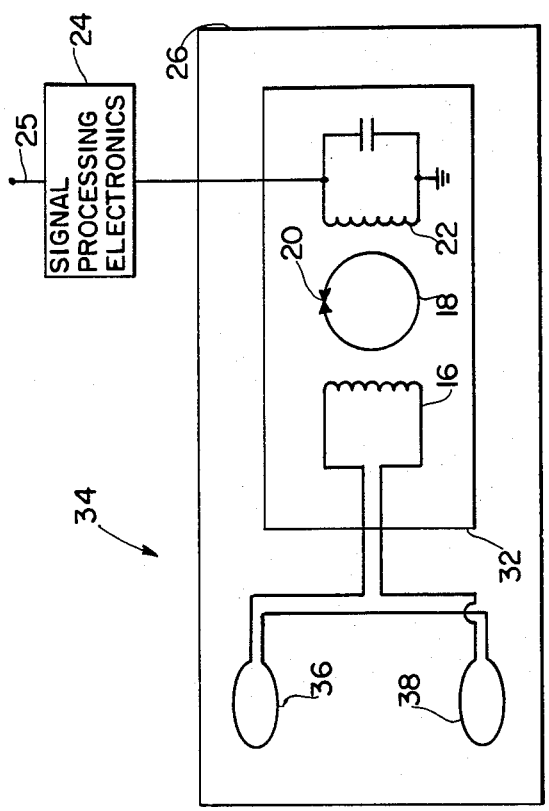
FIGS. 1(a) and 1(b) is a simplified schematic of prior art SQUID magnetometers as used in the present invention for measuring strength and direction of a magnetic field.

With reference to FIG. 1(a), there is illustrated a conventional single-axis SQUID magnetometer as incorporated into the present invention. The SQUID magnetometer, generally designated 12, includes a superconducting input circuit having a superconducting pickup sensor loop 14 which is coupled inductively by superconducting signal coil 16 to a SQUID 18 having a Josephson-junction 20. The SQUID 18 is further coupled by coil 22 and capacitor 29 to signal processing electronics 24. Additionally, coil 22 is magnetically coupled to signal coil 16, the entire combination including capacitor 29 forming a resonant circuit. Sensor loop 14 and SQUID 18 and coils 16 and 22 are all enclosed in a cryostat 26 such as a Dewar chamber. Such chambers are typically constructed with double walls and the space between the walls is evacuated, while the surfaces bounding the space are silvered. Dewars may be made of a fiberglass laminate, such as alternate layers of fiberglass cloth and aluminized Mylar, so as to reduce the radiative heat flow across the vacuum separating the inner vessel and outer jacket of the chamber. The specific construction of a Dewar chamber is well known in the art and as such, the chamber of the present invention is shown as a schematic only. A cryogenic environment is maintained in cryostate 26 through the use of a cooling medium, such as liquid or gaseous helium and appropriate heat transfer media. Capacitor 29 is connected across coil 22 so as to form a resonant (or tank) circuit 31. The signal processing electronics 24 are located external to the cryostate 26. The signal coil 16, the SQUID 18, and the tank circuit 31 are all enclosed in a superconducting magnetic shield 32. The magnetic shield 32 intercepts external magnetic fields and leaves its interior field-free, i.e. shielded from ambient A.C. and D.C. magnetic fields. The magnetic shielding should cover as much as possible all components therein so that the SQUID 18 will measure only the field created by the signal coil 16 and tank circuit 31, which field could be much smaller than the earth's local field.

Figure 1B:
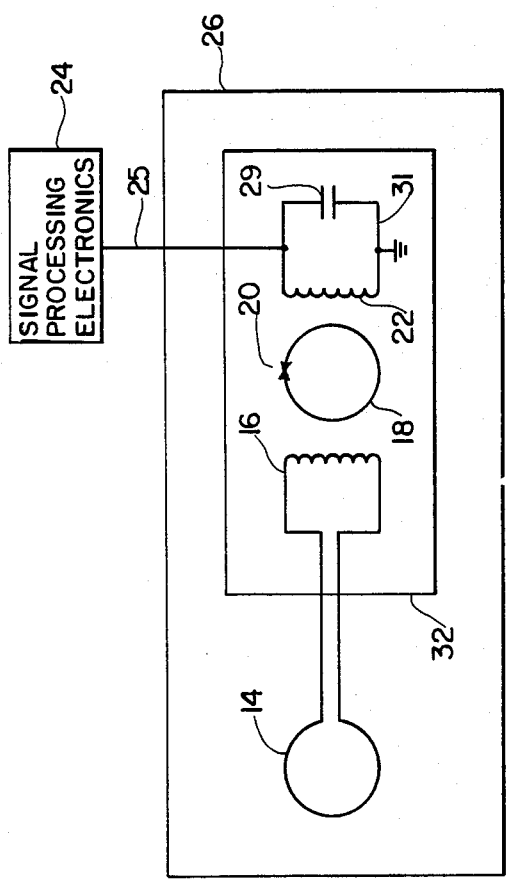

The closed loop 14 of superconducting wire operates as a "primary" coil at the location of the magnetic field being measured while coil 16 operates as a "secondary" coil near the SQUID 18. Loop 14 and coil 16 operatively function together as a "flux transformer". Loop 14 senses the total magnetic field in which it is immersed, averaged over its area and perpendicular to its plane, and this magnetic field inductively creates a shielding current which flows in the flux transformer. The magnetic field generated in coil 16 by this current alters the impedance of SQUID 18. This change in impedance is detected by the signal processing electronics unit 24, which is inductively coupled to SQUID 18 by means of coil 22. An rf technique at the frequency of the overall circuit resonance is used to sense the impedance of SQUID 18. To restore SQUID 18 to its original impedance state the signal processing electronics unit 24 delivers a current via lead 25 to coil 22. When the magnetic field generated in coil 22 by this current exactly compensates the magnetic field from coil 16, SQUID 18 is restored to its original impedance state. The current delivered to coil 22 via lead 25 is directly proportional to the ambient magnetic field in which sensor loop 14 is situated and thus provides a measure of that ambient magnetic field. For this stable measurement condition, a shielding current continues to flow in the circuit comprised of loop 14 and coil 16. Because this distorts the ambient field it may be an undesirable circumstance in instances in which additional magnetometers(s) and/or gradiometer(s) is/are in close proximity. In that instance refinements shown in FIG. 1(b) may be utilized. In this refinement additional components are added comprising leads 27, superconducting magnetic shield 33, and superconducting coils 15 and 17. In this arrangement, the signal processing electronic unit still senses the impedance of SQUID 18 via lead 25 and coil 22, but instead of delivering current to coil 22, it delivers current via leads 27 to coil 15. This induces a current in coil 17, which, in order to restore initial SQUID 18 impedance, must be equal and opposite to the current induced in sensor loop 14 by the ambient magnetic field being measured. Thus, at the measurement condition there is virtually no net current in sensor loop 14, and hence it introduces no ambient field distortion. For the sake of simplicity, subsequent illustrations herein will utilize the circuits of FIG. 1(a), but it will be understood that the circuits of FIG. 1(b), or still others, may be utilized as appropriate.

Signal processing electronics 24 are well known and commercially available for use with SQUID magnetometers. For example, the IEEE publication discussed hereinabove discloses one system whereby the signals received from a SQUID tank circuit are converted to analog signals which are then displayed on a chart recorder and are coupled to a PDP-11 mini-computer for processing. The computed results are plotted on a graphics display terminal.

Other examples of signal processing methods and circuits operable with SQUID magnetometers and gradiometers are discussed in U.S. Pat. No. 3,758,854 to Zimmerman.

Figure 2:
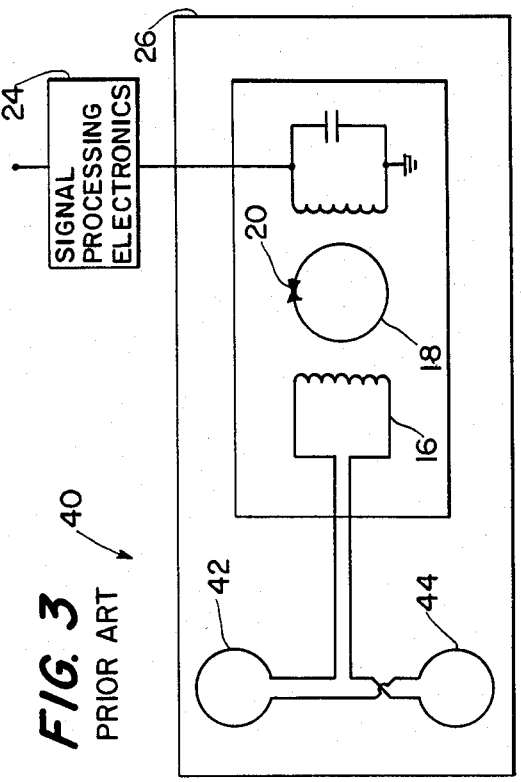
FIG. 2 is a schematic diagram depicting a prior art SQUID gradiometer having diagonal tensor element loops as employed in the present invention.

FIG. 2 shows a conventional SQUID gradiometer 34 having two superconducting loops for measuring a diagonal element of the gradient tensor. A gradiometer is simply a modified magnetometer which employs first and second sensing loops, 36 and 38, rather than just a single loop as used in a conventional magnetometer. First sensing loop 36 and second sensing loop 38 are identical and are arrayed in parallel planes. The two loops 36, 38 are carefully balanced as to size, weight and angular orientation so that one loop is effectively an exact mirror-image duplicate of the other. The two loops 36, 38, which together with signal coil 16 correspond to the "primary" of a conventional SQUID magnetometer, are wound in opposite directions. This opposite winding renders the primary insensitive to a spatially uniform magnetic field, since a positive signal produced in one loop is canceled by a negative in the other. This particular form of magnetometer is referred to as a gradiometer, since it responds to the gradient, or rate of change of field with position, along an axis. Only a magnetic field gradient through the coils 36, 38 can produce a difference between the fluxes through the two coils, hence a net flux in the system which produces a shielding current, the measurement of which being proportional to a diagonal element of the gradient tensor. As with the SQUID magnetometer, the shielding current flows through the signal coil 16, creating a magnetic field that is sensed by a SQUID 18. As is obvious, a similar cryostat 26 with magnetic shielding 32 along with coil 22 and processing electronics 24 are utilized.

Figure 3:
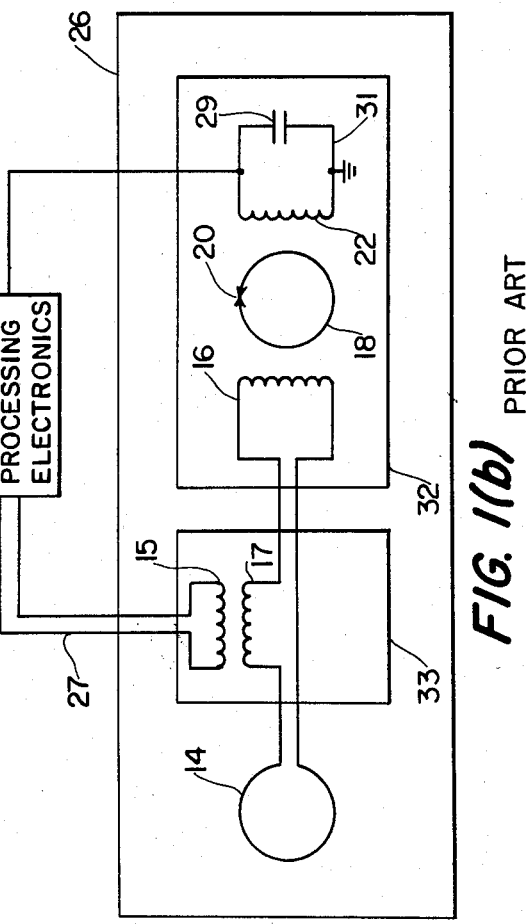
FIG. 3 is a schematic of a prior art SQUID gradiometer having off-diagonal tensor element loops.

FIG. 3 illustrates a gradiometer 40, which is essentially identical to the gradiometer 34 shown in FIG. 2, the only difference being that the first loop 42 and the second loop 44 are arrayed in the same plane to measure an off-diagonal element of the gradient tensor. Accordingly, this particular form of a gradiometer is referred to as an off-diagonal gradiometer.

Figure 4:
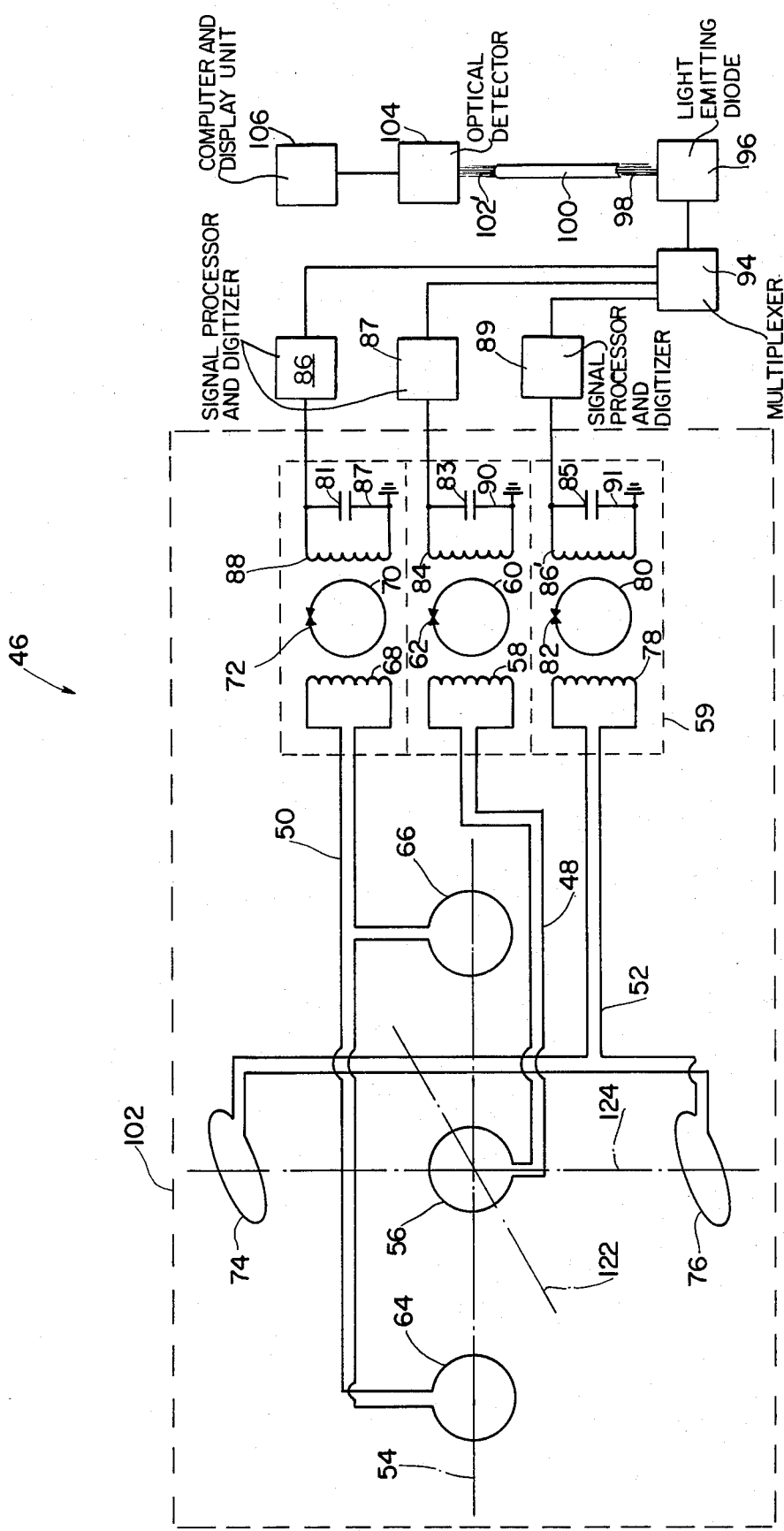
FIG. 4 is a schematic diagram of one rotating unit of the present invention for measuring two components of the magnetic field vector, as well as two diagonal and two off-diagonal elements of the magnetic gradient tensor when rotated about a single axes. When also rotated about a second orthogonal axis it measures the complete magnetic field vector and gradient tensor.
Figure 5:
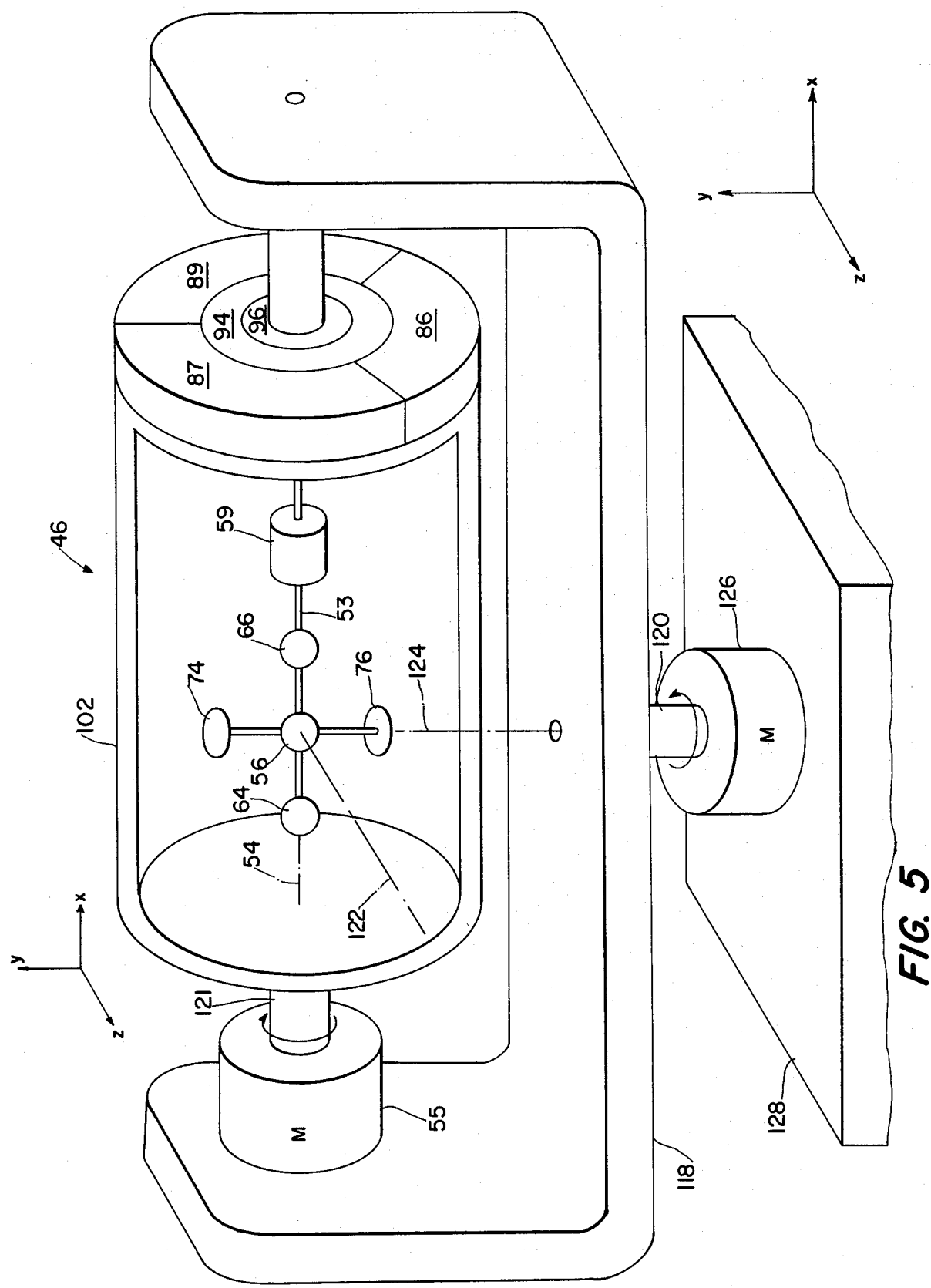
FIG. 5 shows the geometrical structure of the present invention including provisions for rotation of the magnetometer/gradiometer array about two orthogonal axes.

The SQUID magnetometer and gradiometer array of FIGS. 4 and 5 illustrates an embodiment of the present invention, which is designed to utilize the magnetometer, the diagonal loop gradiometer and the off-diagonal loop gradiometer depicted in FIGS. 1, 2 and 3 respectively. The electrical arrangement is shown in FIG. 4, and a geometrical and mechanical configuration is shown in FIG. 5. The essence of the advance in the art is realized by physically rotating about two orthogonal axes an array of SQUID magnetometers or gradiometers or both. Rotating the SQUID gradiometers and magnetometers allows them to scan all directions in their planes of rotation, thus permitting complete determination of all three components of the magnetic field vector and all five independent elements of the gradient tensor using only one SQUID magnetometer, one diagonal gradiometer and one off-diagonal gradiometer.

In a preferred embodiment, there is shown in FIGS. 4 and 5 a SQUID magnetometer and gradiometer array 46 comprising one SQUID magnetometer 48, one SQUID off-diagonal loop gradiometer 50 and one SQUID diagonal loop gradiometer 52. Magnetometer 48 is substantially similar to the SQUID magnetometer shown in FIG. 1 and comprises circular loop 56, the center of which lies on axis 54, and a signal coil 58 inductively coupled to SQUID 60 having Josephson-junction 62. Off-diagonal loop gradiometer 50 is substantially similar to the off-diagonal loop gradiometer shown in FIG. 3 and comprises a first circular loop 64 and a second circular loop 66, the centers of each lying on axis 54 and being equidistantly spaced from magnetometer loop 56 and from axis 124. Off-diagonal loop gradiometer 50 is inductively coupled by means of signal coil 68 to SQUID 70 having Josephson-junction 72. Diagonal loop gradiometer 52 is substantially similar to the diagonal loop gradiometer shown in FIG. 2 and is comprised of a first circular loop 74 and a second circular loop 76, the centers of which lie on axis 124 and are equidistant from axis 54. These loops 74 and 76 are inductively coupled by means of signal coil 78 to SQUID 80 having Josephson-junction 82. Sensing loops 56, 64, 66, 74, and 76 and associated connections and circuits are all mounted fixedly to a non-electrically conductive structure 53, which would be more massive and more stable structurally than depicted here. The loops and structure 53 as well as the cryogenic container 102 would all be rotatable about axis 54 and about axis 124, these axes being mutually orthogonal.

Pickoff coil 84 is inductively coupled to SQUID 60 to complete the resonant circuit which provides an output signal representative of the magnetometer loop 56 detection to the signal processing and digitizing electronics 87. Similarly, pickoff coil 88 is inductively coupled to SQUID 70 so as to receive an output signal from off-diagonal loop gradiometer 50, while pickoff coil 86' is inductively coupled to SQUID 80 to receive output signals from diagonal loop gradiometer 52. The signals received by coils 88, 84, and 86' are applied to the signal processing and digitizing electronics 86, 87, and 89 respectively. Capacitor 81 is connected across coil 88 to complete tank circuit 87 which is representative of all external measuring circuitry inductively coupled to SQUID 70. Similarly, capacitor 83 is connected across coil 84 to represent an equivalent tank circuit 90 coupled to SQUID 60, and capacitor 85 is connected across coil 86' to complete tank circuit 91 coupled to SQUID 80.

A three-compartment superconducting magnetic shield 59 shields the three SQUID circuits from each other and from ambient magnetic fields. One compartment of shield 59 contains signal coil 68, SQUID 70, and tank circuit 87; another compartment contains signal coil 58, SQUID 60 and tank circuit 90; the third compartment contains signal coil 78, SQUID 80 and tank circuit 91.

The magnetometer 48 and the two gradiometers 50 and 52 together with the magnetic shield 59 and structure 53 are situated within cryostat 102. The electronic signal processing and digitizing units 86, 87, and 89 are attached to the outside of cryostate 102. They provide digital signals to a multiplexer 94, also attached to the outside of cryostat 102. The output of multiplexer 94 drives a light emitting diode (LED) (or an injection laser) 96 also attached to the outside of cryostat 102. The output of LED 96 is a modulated optical beam which carries the magnetometer and gradiometer signals via a small air gap 98, an optical fiber 100, and a second small air gap 102' to an optical detector 104 which in turn provides digital electronic signals to a computer and display unit 106.

The entire magnetometer/gradiometer and cryostat assembly together with associated electronic and optical units 86, 87, 89, 94, and 96 may be rotated to a plurality of positions about axis 54 by shaft 121 driven by nonmagnetic motor 55, which for example may be powered by compressed air. Motor 55 is rigidly attached to yoke 118 which may in turn be rotated to a plurality of positions about axis 124 by shaft 120 driven by nonmagnetic motor 126 which is rigidly affixed to platform 128, which may be either stationary or mobile. The two small air-gap optical links 98 and 102 allow signal transfer between members in relative motor, viz. from LED 96 (attached to cryostat 102) to optical fiber 100 (attached to yoke 118) and from optical fiber 100 to detector 104 (attached to platform 128). Of course other means, such as capacitance coupling, or microwave links could be used in place of optical links.

In the embodiment shown in FIGS. 4 and 5 the magnetometer 48 and gradiometers 50 and 52 are each operated independently and in a conventional manner as previously described, the exception being that the magnetic measurements are made while rotating the sensing loops 56, 64, 66, 74, and 76. The rotation rates about axes 54 and 124 would be chosen so as to minimize instrumental noise, as will be discussed later, and must be rapid enough to track in time the changes of the magnetic signals being measured. In most conceivable applications the frequency of rotation about axis 54 would be much greater than the frequency of rotation about axis 124. Alternatively, rotation about axis 124 might be stepped at intervals of $(\pi/2)$ while rotation about axis 54 is continuous. In still another alternative yoke 118 may be fixed relative to platform 128 while the magnetometer/gradiometer unit rotates about axis 54. This would be used in conjunction with a second magnetometer/gradiometer unit identical except for the omission of the diagonal gradiometer which would be situated with its axis of rotation orthogonal to the axis of rotation of the aforementioned magnetometer/gradiometer. This alternate configuration would be more suitable for measuring magnetic fields and gradients which change more rapidly with time.

Figure 6A:
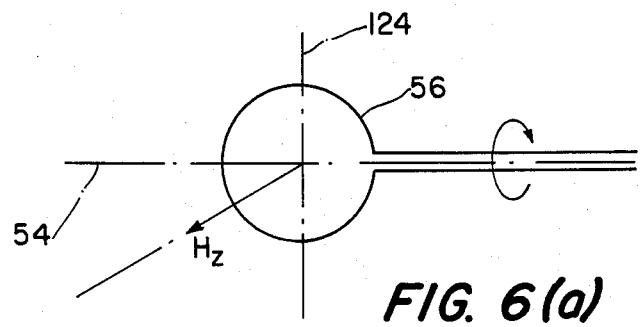
FIGS. 6(a), 6(b) and 6(c) is a diagram showing how a single magnetometer loop may be positioned by rotation so as to measure the three magnetic components which describe completely the magnetic field vector.
Figure 6B:
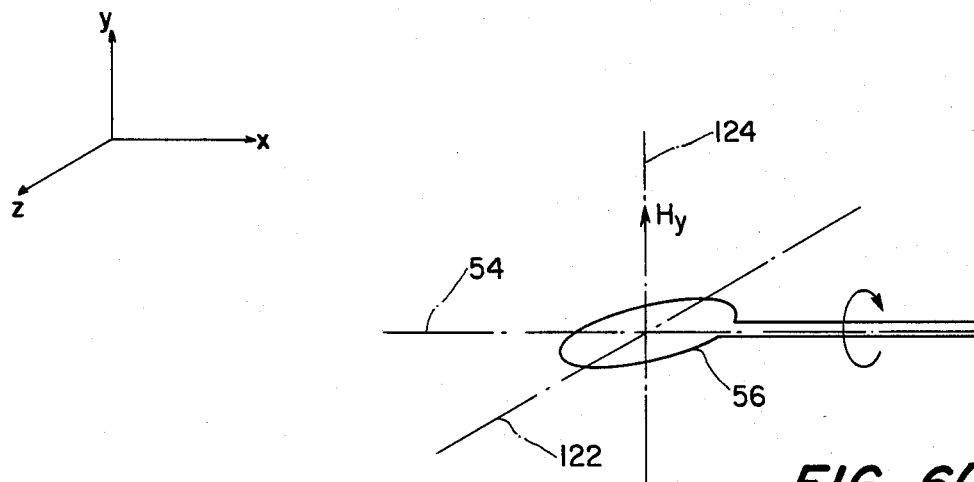
Figure 6C:
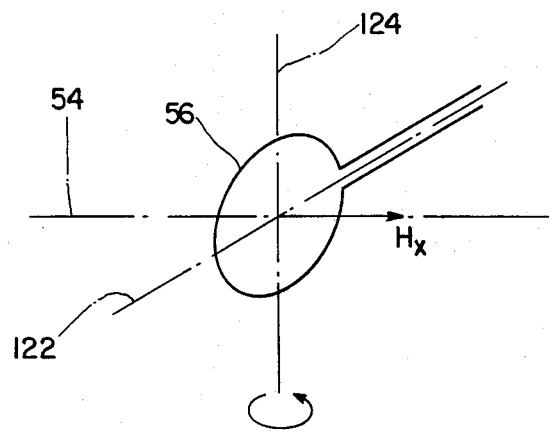

To explain the principle of operation of the present invention in the simplest manner, reference is made to FIG. 6. In FIG. 6(a) the SQUID magnetometer sensor loop 56 of FIGS. 4 and 5 is shown lying in the xy-plane of an assumed xyz coordinate system. In this position it measures the $H_z$ magnetic field component. (The magnetic field strength H is measured in Tesla.) When the loop 56 is rotated by $(\pi/2)$ about a diameter lying on axis 54 parallel to the x-axis it is brought into coincidence with the xz-plane as in FIG. 6(b), and in this orientation it measures the $H_y$, magnetic field component. Starting again from FIG. 6(a) and rotating loop 56 by $(\pi/2)$ about a diameter lying along axis 124, loop 56 is brought into coincidence with the yz-plane as in FIG. 6(c), and in this orientation it measures the $H_x$ magnetic field component. Thus all three components ($H_x$, $H_y$, and $H_z$) of the magnetic field vector are determind. It should be emphasized at this point that the rotating SQUID magnetometer loop 56 measures the instantaneous field component perpendicular to the sensing loop at each instant of time rather than the time derivative of the field as measured by a conventional rotating coil or voltage generator type of magnetometer. Thus a rotating SQUID magnetometer takes the place of two stationary SQUID magnetometers. Similarly a single rotating SQUID gradiometer can take the place of two stationary SQUID gradiometers.

Figures 7A, 7B:
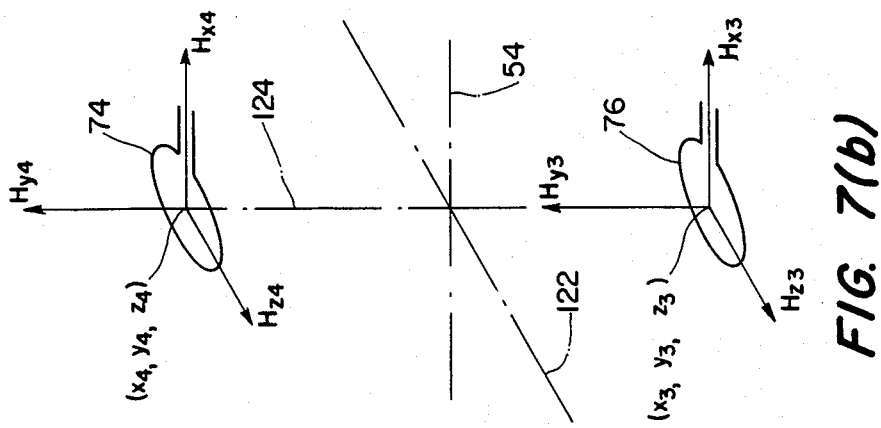
FIGS. 7(a) and 7(b) is a diagram showing the manner in which magnetic field gradients are determined by an off-diagonal gradiometer and a diagonal gradiometer.

With reference to FIG. 7 the principle of operation of gradiometers 50 and 52 may be illustrated. In FIG. 7(a) the loops 64 and 66 of off-diagonal gradiometer 50 are centered at $(x_1, y_1, z_1)$ and $(x_2, y_2, z_2)$ where they measure the fields $H_{z1}$, and $H_{z2}$ respectively yielding $$\frac{H_{z2} - H_{z1}}{x_2 - x_1} \simeq \frac{\partial H_z}{\partial x}$$

Similarly for diagonal gradiometer 52 as shown in FIG. 7(b)

$$\frac{H_{y4} - H_{y3}}{y_4 - y_3} \simeq \frac{\partial H_y}{\partial y}$$

Rotations of these two gradiometers about axes 54 and 124 provide determinations in addition of $$\frac{\partial H_x}{\partial x}, \frac{\partial H_x}{\partial z}, \frac{\partial H_y}{\partial x}, \frac{\partial H_y}{\partial z}, \text{ and } \frac{\partial H_z}{\partial z}.$$

Because the magnetic gradient tensor is traceless $$\left( \frac{\delta H_x}{\delta x} + \frac{\delta H_y}{\delta y} + \frac{\delta H_z}{\delta z} = 0 \right)$$

and because it is symmetric $$\frac{\partial H_x}{\partial y} = \frac{\partial H_y}{\partial x}, \frac{\partial H_z}{\partial x} = \frac{\partial H_x}{\partial z}, \frac{\partial H_y}{\partial z} = \frac{\partial H_z}{\partial y}$$

the entire gradient tensor $$\begin{vmatrix} \frac{\delta H_x}{\delta x} & \frac{\delta H_y}{\delta x} & \frac{\delta H_z}{\delta x} \\ \frac{\delta H_x}{\delta y} & \frac{\delta H_y}{\delta y} & \frac{\delta H_z}{\delta y} \\ \frac{\delta H_x}{\delta z} & \frac{\delta H_y}{\delta z} & \frac{\delta H_z}{\delta z} \end{vmatrix}$$

is thus determined.

Figure 8A:
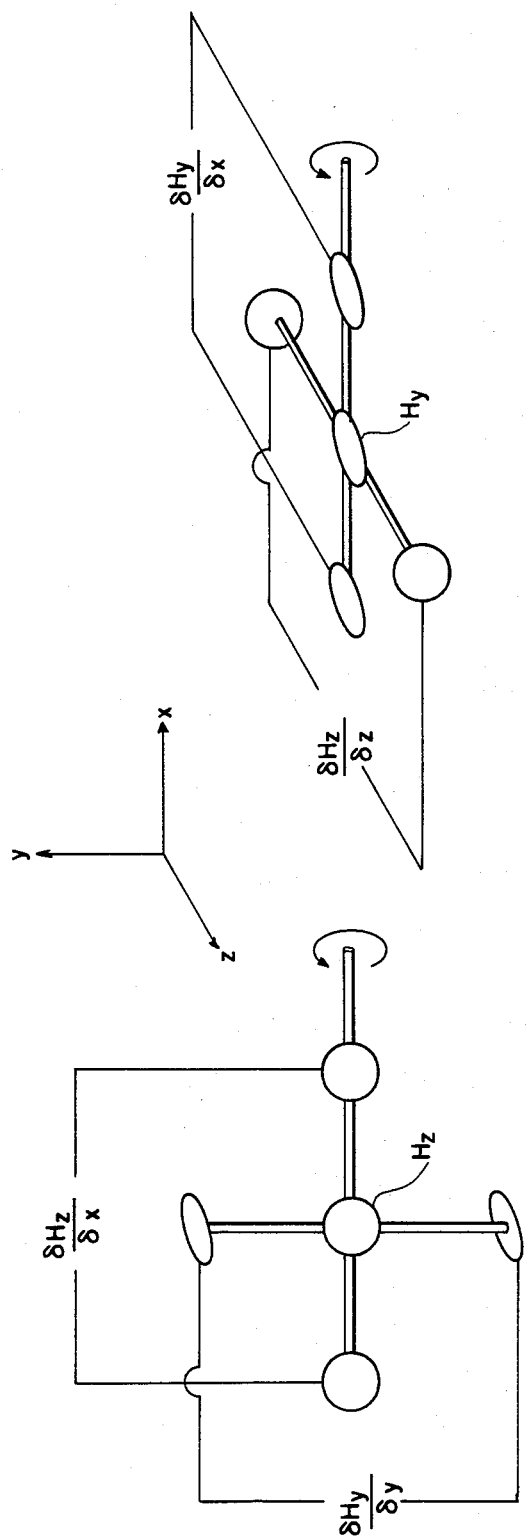
FIGS. 8(a) and 8(b) is a diagram showing two magnetometer/gradiometer arrays which may be separately rotated about mutually orthogonal axes so as to determine completely the magnetic field vector and the magnetic field gradient tensor.

The approach described above is applicable to stationary platform mounting or to vehicle mounting for instances in which the measured magnetic field and the measured gradient change slowly relative to the times of rotation of the magnetometer/gradiometer array. For instances in which the measured quantities change rapidly in time it may be desirable to utilize two separately rotating systems as depicted schematically in FIG. 8. FIG. 8(a) shows the first magnetometer/gradiometer array structure which rotates about the x-axis and is comprised of a magnetometer, a diagonal gradiometer, and an off-diagonal gradiometer. In the two orientations depicted this array measures $$H_y, H_z, \frac{\partial H_y}{\partial x}, \frac{\partial H_z}{\partial x}, \frac{\partial H_y}{\partial y}, \text{ and } \frac{\partial H_z}{\partial z}.$$

Figure 8B:
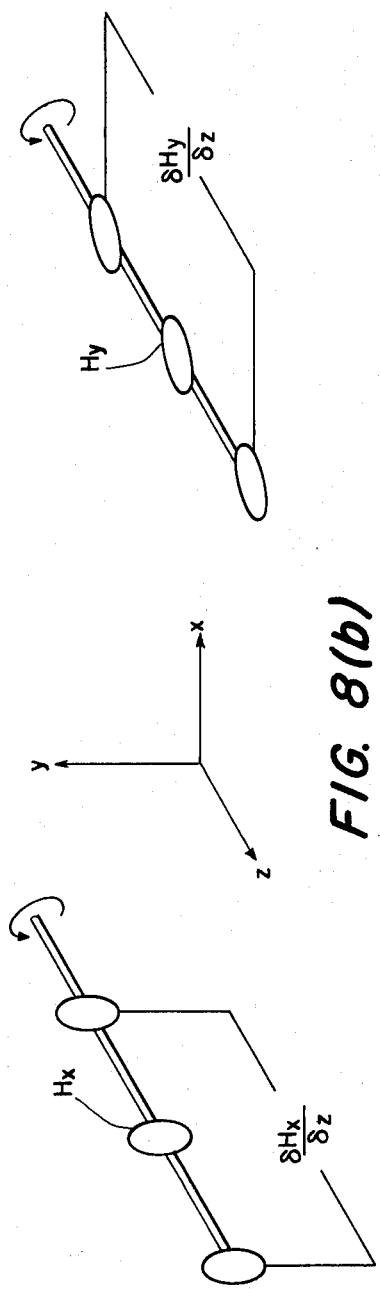

FIG. 8(b) shows the secomd magnetometer/gradiometer array structure which rotates about the z-axis and is comprised of a magnetometer and an off-diagonal gradiometer. In the two orientations depicted this array measures $$H_x, H_y, \frac{\partial H_x}{\partial z}, \text{ and } \frac{\partial H_y}{\partial z}.$$

These two systems together thus measure completely the magnetic field vector and the magnetic field gradient tensor. It would probably be desirable (though not necessary) that the two arrays roatate at the same rate, which could be accomplished with a single motor and a right angle gear drive.

Figure 9:
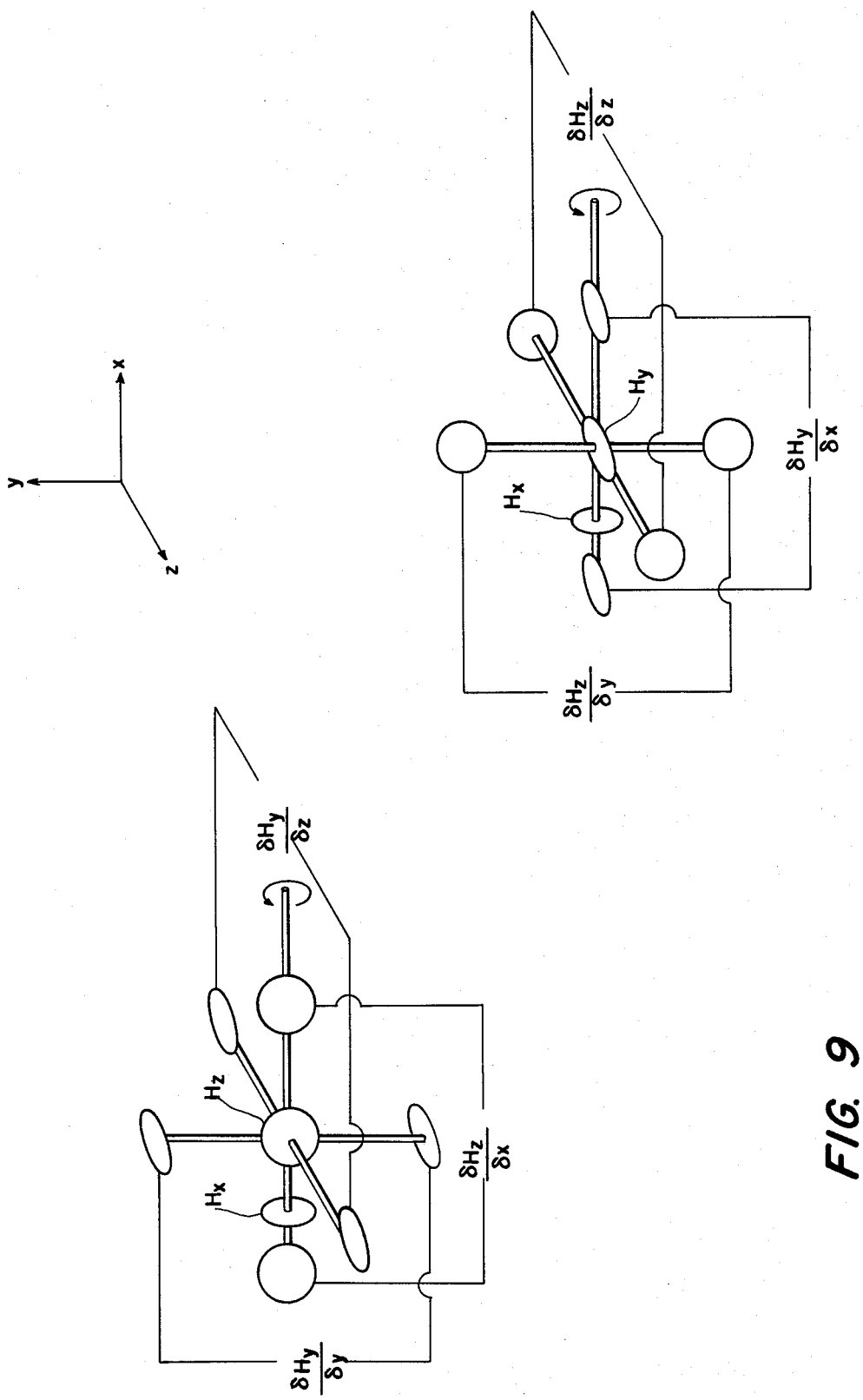
FIG. 9 is a diagram showing a single magnetometer/gradiometer array which may be rotated about a single axis so as to determine completely the magnetic field vector and the magnetic field gradient tensor.

Still another embodiment is depicted in FIG. 9. Two orientations are shown for a structure and magnetometer/gradiometer measurement array consisting of two magnetometers, one diagonal gradiometer, and two off-diagonal gradiometers all of which rotate about the x-axis only. In the two orientations depicted this array measures $$H_x, H_y, H_z, \frac{\partial H_y}{\partial x}, \frac{\partial z}{\partial x}, \frac{\partial H_y}{\partial y}, \frac{\partial H_z}{\partial y}, \frac{\partial H_y}{\partial z}, \text{ and } \frac{\partial H_z}{\partial z}.$$

Thus the magnetic field vector and the magnetic field gradient tensor are both completely determined. While this arrangement offers the advantage of a single rotating array combined with a single axis of rotation the magnetometer which measures $H_x$ does so for all angles of rotation and hence does not enjoy the internal magnetic noise reduction benefits realized by the other magnetometer and gradiometers by virtue of the magnetic flux reversals they experience during rotation.

With reference again to the embodiment depicted in FIG. 4, signal processing electronics 86, 87, and 89 are used to process data on the components of the vector magnetic field, as measured by the rotating magnetometer 48, and the components of the field gradient tensor, as measured by rotating gradiometers 50, 52. While the data processing electronics are not part of the instant invention, any known conventional signal processing means could be used and the electronics 86, 87 and 89 are deemed to be representative only of the various signal processing means available. For example, the electronics 86, 87 and 89 might well be considered representative of the method disclosed in *IEEE Transactions of Magnetics*, discussed supra, where the output signals from the magnetometer and gradiometer array could be analyzed as digitized analog signals coupled to a PDP-II mini-computer for processing.

In that IEEE reference, a magnetic source is modeled as a point dipole. The position and moment of the dipole are then obtained from the observed first field derivatives at a single point by inverting the set of equations obtained by differentiating the field of a magnetic dipole. The field derivative equations thus obtained are non-linear and are in a closed form which is readily handled on a mini-computer. Specifically, a magnetic source is approximated by a point dipole of moment $\vec{m}$ located at the origin of a spatial coordinate system. The observation point position relative to the dipole is denoted by $\vec{r}$, and $\hat{n}$ is a unit vector in the direction of $\vec{r}$. One would like to be able to determine the strength and location of the source from measurements made at the observation point. The magnetic field $\vec{H}$ at the observation point is given by the familiar dipole expression $$\vec{H} = \frac{3(\vec{m} \cdot \vec{r})\vec{r}}{r^5} - \frac{\vec{m}}{r^3}$$

where r is the distance from the source to the observation point.

If the field components are differentiated with respect to the spatial coordinates, a set of nine equations results, the field derivative equations, which can be compactly written in the form $$\frac{\partial H_k}{\partial x_j} = -\sum_i M_i N_{ijk}.$$

The subscripts take on values 1,2,3 and denote respectively components along the x,y,z axes. The three quantities $$M_i \equiv 3m_i/r^4$$

are called scaled moments, and the quantity $$N_{ijk} = 5n_i n_j n_k - (\delta_{ki} n_j + \delta_{kj} n_i + \delta_{jk} n_k)$$

is a third rank tensor which is a function of the direction cosines ($n_1$, $n_2$, $n_3$) of $\vec{r}$ only.

Although there are nine field derivative equations, only five of them are independent since Maxwell's equations require that the matrix formed from the field derivatives be symmetric and traceless. Furthermore, the three scaled moments and the two independent direction cosines constitute a set of five unknowns. Hence, we have in effect, a system of five equations in five unknowns which need to be solved once the field derivatives have been measured. To determine the range r and the moments themselves requires one additional observation. One component of the field itself can be measured.

The first step in the inversion is to solve the field derivative equations for the scaled moments. This can be done with the aid of another third rank tensor $$\tilde{N}_{nkl} = \frac{3}{2} n_j n_k n_l - \frac{1}{2}(\delta_{jl} n_k + \delta_{kl} n_j)$$

which in a sense is the inverse of $N_{ijk}$. That is $$\Sigma_{jk} N_{ijk} \tilde{N}_{jkl} = \delta_{il}$$

Contracting both sides of the field derivative equations with $N_{jkl}$ yields $$M_l = -\Sigma_{jk} \frac{\delta H_k}{\delta X_j} N_{jkl}$$

Substituting this back into the field derivative equations, this yields $$\frac{\delta H_k}{\delta x_i} = \Sigma_{lmi} \frac{\delta H_m}{\delta x_i} \tilde{N}_{lmi} N_{ijk}$$

This is a system of equations relating the unknown direction cosines (which are contained in $N_{lmi} N_{ijk}$) to the observed field derivatives. Its solution lies at the crux of the inversion problem since once the direction cosines are known, the scaled moments can be obtained from the preceding expression.

The solution of this system of equations can be accomplished in three steps. First a rotation is performed to the principle axis frame of the field derivative matrix. The equations are solved in that frame and then the solutions are transformed back to the laboratory frame.

In the principle axis frame, these equations are particularly simple and reduce to five equations which are quadratic in the squares of the direction cosines. These quadratic equations are easily solved and yield four physically acceptable solutions. They are shown in FIG. 10 along with the corresponding solutions for the scaled moments.

Only one of these solutions represents the true magnetic source. The other three "ghost solutions" can usually be eliminated by some a prior knowledge of the source location; for example, knowledge that the source is located in a particular spatial octant is sufficient.

A general expression for the rotation connecting the laboratory and principle axis frames can be obtained by considering the idempotents associated with the field derivative matrix $$\Lambda_{jk} = \frac{\partial H_k}{\partial x_j}$$

The idempotents are three non-zero matrices defined by $$E_i = \frac{\prod\limits_{j \neq i} (\Lambda - \lambda_j I)}{\prod\limits_{j \neq i} (\lambda_i - \lambda_j)}$$

where I is the unit matrix and the $\lambda_i$ are the eigenvalues of . The eigenvalues can be found from the measured derivatives by standard means. It is then possible to show that the idempotent satisfies the relation $$E_i \Lambda = \lambda_i E_i.$$

Thus, the rows of $E_i$ are eigenvectors of $\Lambda$ and can be used to construct the rotation matrix that diagonalizes $\Lambda$. The desired rotation matrix is thus given by $$R_{in} = \frac{\epsilon_i (E_i)_{mn}}{(E_i)_{mn}}$$

where m is any fixed index such that $$(E_i)_{mn} \neq 0.$$

The signs $\epsilon_i = \pm 1$ are arbitrary except that they must be chosen so that the determinant of R is plus one. However, for tracking purposes, care must be exercised in selecting the $\epsilon_i$ so that the principle axes do not make a discontinuous jump relative to the laboratory frame. Such a discontinuous jump results in the appearance of a ghost solution in place of the true solution.

Once the rotation R is obtained, it is a simple matter to transform the unit vector $\vec{n}$ and the scaled moment vector M back to the laboratory frame thus accomplishing the complete inversion of the field derivative equations.

It should be again noted that the complete field description thus obtained in the IEEE publication requires the use of five SQUID gradiometers and three SQUID magnetometers. In the system disclosed herein, the same field measurements could be obtained with only one SQUID magnetometer and two SQUID gradiometers.

In addition to reducing the number of SQUID magnetometers and grandiometers needed for measuring the magnetic field and field gradients a further substantial advantage is realized by the rotation of the magnetometer and gradiometer array of FIG. 4. As shown in FIG. 11 measurements of the noise spectra of SQUID's show that their noise power density is relatively constant from approximately 1 Hz to 100 Hz, but below approximately 1 Hz the noise power density increases approximately in inverse proportion to frequency raised to a power of the order of 1.5. Accordingly, in prior SQUID magnetometer/gradiometer devices SQUID noise interference is more troublesome for signals which occur in the frequency range below approximately 1 Hz. In the present invention rotation of the SQUID magnetometer/gradiometer at a frequency of revolution greater than approximately 1 Hz places the desired signal in a frequency range of reduced SQUID instrumental noise. As is apparent from FIG. 11 even very modest rotation frequencies are sufficient to raise the signal frequency above the high noise region and well into the lower-noise "white noise" region. This permits the delivery of more decipherable output signals to the processor electronics and accordingly a more accurate magnetic field/gradient determination.

FIG. 12 provides a simple example of how the signal from a rotating magnetometer or gradiometer is separable from low frequency instrumental noise. The signal appears as a high-frequency oscillating component superimposed on a low-frequency (dashed line) noise background. In the illustration the noise level is several times greater in magnitude than the signal level. Nonetheless, the desired information, two magnetic field or gradient components may be deduced by standard signal processing techniques from the phase and amplitude of the high-frequency signal.

The present invention recognizes that a significant improvement in accuracy and simplicity can be achieved by rotating a SQUID magnetometer and gradiometer array as a means for measuring magnetic fields. Whereas all prior art arrays were not rotating while being used to measure magnetic fields, the instant invention performs the same measurements utilizing fewer magnetometers and gradiometers while delivering the measured field signals over a narrow frequency band. Delivery of the measured signals over a narrow frequency band in the low SQUID noise region results in a much lower instrumental noise than was possible with the prior art devices. Accordingly, a much more accurate magnetic field description can be achieved.

While the invention has been illustrated with respect to rotating an array of SQUID magnetometers and gradiometers, it will be appreciated that the invention could be used in many different applications and that many variations and modifications are apparent. For example, where SQUID magnetometers and gradiometers are carried on moving vehicles, the rotation frequency could be chosen to substantially exceed the motional frequencies characteristic of the vehicle, such that motion compensation is more easily accomplished. Simply stated, during the time it takes to make a given measurement, the vehicle does not have time to roll, pitch or yaw appreciably. Each measurement could be referenced to a gryoscope and inertial sensors.

A further improvement of the instant invention over prior gradiometers is to be found in the ease with which gradiometer balance may be accomplished. With the gradiometer rotating in a uniform (homogeneous) magnetic field it is necessary only to tune the gradiometer balance adjustment to zero (or minimum) signal at the rotation frequency. With conventional gradiometers balance can be accomplished only by laborious and time consuming movement of the system, which, in the case of gradiometer fixed to moving vehicles, may even involve moving the entire vehicle to various orientations. Such time consuming actions are subject to uncertainties and inaccuracies which arise from temporal variations of the "homogeneous" magnetic field during the time required for repositioning.

In some applications, it might be desirable to locate a second rotating SQUID magnetometer/gradiometer array within a platform which itself rotates about an axis perpendicular to that of a first rotating SQUID magnetometer or gradiometer.

An alternative embodiment of the instant invention might employ the use of different rotation rates between the SQUID magnetometers and gradiometers, as was previously mentioned, such rates being chosen to obtain the desired data scan. One of the rotations might be a stepping rotation rather than a uniform angular motion. Such a double rotation scheme would probably be best suited to stationary site operation, although in special instances use on a moving vehicle may be desirable.

In another variation, it is envisioned that a radio frequency or microwave pickoff system could be employed in place of the optical signal pickoff means of the preferred embodiment. However, care would have to be exercised to assure that such an rf or microwave signal would not result in undesirable feedback via the SQUID magnetometer/gradiometer sensor loops.

Therefore, many modifications and embodiments of the specific invention will readily come to mind to one skilled in the art having the benefit of the teachings presented in the foregoing description and the accompanying drawings of the subject invention, and hence it is to be understood that the invention is not limited thereto and that such modifications, etc., are intended to be included within the scope of the appended claims.

What is new and desired to be secured by Letters Patent is:

1. A continuously rotatable SQUID device for measuring magnetic field vector components, said device comprising:
   a non-electrically-conductive cryogenic container having mutually orthogonal first and second axes and being rotatable about these axes,
   SQUID magnetometer sensor means mounted in the container and generally made up of a sensor loop, a signal coil, a pickoff coil and a SQUID; the sensor loop being mounted in the container in centered and spaced relation to the first and second axes and being electrically coupled to the signal coil, the SQUID being interposed between and inductively coupled to the signal and pickoff coils, the sensor loop providing a signal representative of the vector component of a magnetic field perpendicular to the plane of the sensor loop for every rotating position of the sensor loop,
   yoke means mounting the container for rotation about its first axis,
   platform means connected to the yoke means,
   signal processing means connected to the pickoff coil and operatively associated with the container, yoke means and platform means for processing and analyzing the signal from the sensor loop during rotation of the loop in a magnetic field,
   said yoke means including first non-magnetic motor means for continuously rotating the container about its first axis at a frequency greater than approximately one (1) Hertz, and
   said platform means including second non-magnetic motor means for selectively rotating the container about its second axis whereby rotation of said container by at least said first motor means at a frequency greater than approximately 1 Hertz eliminates high background noise at low frequency so as to enable analysis by the processing means of the signal from the magnetometer sensor means and accurate description of vector components of the magnetic field.

2. A continuously rotatable SQUID device for simultaneously measuring magnetic field vector components and magnetic field gradient tensor components, said device comprising:
   a non-electrically-conductive cryogenic container having mutually orthogonal first and second axes and being rotatable about these axes,
   SQUID magnetometer sensor means mounted in said container in centered and spaced relation to the container axes for sensing the vector components of a magnetic field,
   at least one SQUID gradiometer sensor means mounted in said container in centered and spaced relation to the container axes and the magnetometer sensor means, the gradiometer sensor means for sensing the tensor components of a magnetic field gradient,
   yoke means mounting the container for rotation about its first axis,
   platform means connected to the yoke means;
   signal processing means connected to the magnetometer and gradiometer sensor means and being operatively associated with the container, yoke means and platform means for processing and analyzing the signals generated in the magnetometer and gradiometer sensor means during rotation of the container in a magnetic field, said yoke means including non-magnetic motor means for rotating the container about its first axis at a frequency greater than approximately one (1) Hertz, and said platform means including second non-magnetic motor means for selectively rotating the container about its second axis whereby rotation of the container by at least said first motor means at a frequency greater than approximately 1 Hertz eliminates high background noise at low frequency so as to enable analysis by the processing means of signals from both the magnetometer and gradiometer sensor means and accurate description of vector and tensor components of the magnetic field being described.

3. A SQUID device as set forth in claim 2 wherein said magnetometer sensor means is generally comprised of a sensor loop, a signal coil, a SQUID, and a pickoff coil, the sensor loop being arranged in centered and spaced relation to the container axes and electrically coupled to the signal coil, the SQUID being interposed between and inductively coupled to the signal and pickoff coils; and wherein the gradiometer sensor means is generally comprised of second and third sensor loops, a second signal coil, a second SQUID and a second pickoff coil, the second and third sensor loops being spaced equidistant from each other and arranged in centered and spaced relation to the first sensor loop, the second and third sensor loops being electrically coupled to the second signal coil, the second SQUID being interposed between and inductively coupled to the second signal coil and the second pickoff coil; and also wherein the signal processing means are connected to the first and second pickoff coils in order to enable analysis of the signals from the first sensor loop of the magnetometer sensor means and the signals from the second and third sensor loops of the gradiometer sensor means for all rotating positions of said first, second and third sensor loops during rotation of said container by at least said first motor means so as to enable accurate description of vector and tensor components of a magnetic field.

4. A SQUID device as in claim 3 wherein the second and third sensor loops lie in a common plane.

5. A SQUID device as in claim 3 wherein the second and third sensor loops lie in parallel spaced planes.

6. A SQUID device as in claim 3 wherein the container includes magnetic shield means for enclosing the signal coil, SQUID and pickoff coil of the magnetometer sensor means and the second signal coil, second SQUID and second pickoff coil of the gradiometer sensor means.

7. A continuously rotatable SQUID device for simultaneously measuring magnetic field vector components and magnetic field gradient tensor components, said device comprising:

a non-electrically-conductive cryogenic container having mutually orthogonal first and second axes and being rotatable about the first and second axes, SQUID magnetometer sensor means mounted in said container in centered and spaced relation to the container axes for sensing the vector components of a magnetic field during rotation of the container, first and second SQUID gradiometer sensor means mounted in said container in mutually orthogonal relationship to each other and in centered and spaced relation to the magnetometer sensor means, the first and second gradiometer means for sensing the tensor components of magnetic field gradients during rotation of the container, yoke means connected to opposite portions of the container for mounting the container for rotation about its first axis, platform means connected to the yoke means for supporting the container for selective rotation about its second axis, signal processing means connected to the magnetometer sensor means and the first and second gradiometer sensor means and being operatively associated with the container, yoke means and platform means during rotation of the container in relation to a magnetic field, said yoke means including first non-magnetic means for continuously rotating the container about its first axis at a frequency greater than approximately one (1) Hertz, and said platform means including second non-magnetic motor means for selectively rotating the container about its second axis whereby the rotation of said container by at least said first motor means at a frequency greater than approximately 1 Hertz eliminates high background device noise in order to enable analysis by the processing means of the signals from the magnetometer sensor means and the first and second gradiometer sensor means and accurate description of vector and tensor components of the magnetic field being described.

8. A device as in claim 7 wherein said second motor means selectively rotates the container at least 90° about its second axis.

9. A device as in claim 7 wherein said magnetometer sensor means is generally comprised of a sensor loop, a signal coil, a pickoff coil and a SQUID; the sensor loop being electrically coupled to the signal coil and being arranged in centered and spaced relation to the container first and second axes, the SQUID being interposed between and inductively coupled to the signal coil and the pickoff coil, further wherein the first gradiometer means is generally made up of first and second sensor loops, a first signal coil, a first pickoff coil, a first SQUID; the first and second sensor loops being electrically coupled to the first signal coil and being arranged in centered and spaced relationship to the sensor loop of the magnetometer sensor means; the first SQUID being interposed between and inductively coupled to both the first signal and the first pickoff coils, also wherein the second gradiometer sensor means is generally made up of third and fourth sensor loops, a second signal coil, a second pickoff coil and a second SQUID; the third and fourth sensor loops being electrically coupled to the second signal coil and being arranged in centered and spaced relationship to the sensor loop of the magnetometer sensor means as well as being in spaced and mutually orthogonal relationship to the first and second sensor loops of the first gradiometer sensor means; the second SQUID being interposed between and inductively coupled to both the second signal coil and the second pickoff coil, and also wherein the signal processing means is operatively associated with and connected to the pickoff coil of the magnetometer sensor means and the first and second pickoff coils of the first and second gradiometer sensor means.

10. A method of measuring a magnetic field which comprises the steps of:

mounting a SQUID magnetometer sensor device in a non-electrically-conductive cryogenic container having first and second mutually orthogonal axes, with the container being continuously rotatable about its first axis and selectively rotatable about its second axis, the sensor device being made up of a magnetic field sensor loop in centered and spaced relation to the first and second axes, positioning said container and the sensor device therein in a magnetic field to be measured, continuously rotating the container loop about its first axis at a frequency greater than approximately one Hertz in order to eliminate high background noise of the device so that the rotating loop will pass through a plurality of positions in the magnetic field and provide a deducible oscillatory signal for the magnetic field being measured, selectively rotating the container about its second axis including the sensor loop so as to reorient the container in another position in relation to the magnetic field being measured as the container including the sensor loop continue to rotate about the first axis, and analyzing the signals received from the sensor loop as the container continuously rotates about the first axis and selectively rotates about the second axis so as to measure the magnetic field.

11. A method as in claim 10 wherein the step of continuously rotating is effected by a yoke means connected to opposite portions of the container, the yoke means including non-magnetic motor means for effecting rotation of the container about its first axis.

12. A method as set forth in claim 10 wherein the step of selectively rotating the sensor loop about the second axis is effected by a platform means connected to the yoke means, the platform means including non-magnetic motor means for effecting selective rotation of the container about its second axis.

13. A method of measuring a magnetic field which comprises the steps of:

mounting a combined SQUID magnetometer sensor device and at least one SQUID gradiometer sensor device in a non-electrically-conductive cryogenic container having first and second mutually orthogonal axis, with the container being continuously rotatable about its first axis and selectively rotatable about its second axis, the magnetometer sensor device being made up of a magnetic field sensor loop in centered and spaced relation to the first and second axes, the gradiometer sensor device being made up of a pair of spaced sensor loops in centered and spaced relation to the magnetometer sensor loop, positioning said container and the sensor devices therein in a magnetic field to be measured, continuously rotating the container including the magnetometer and gradiometer sensor loops about its first axis at a frequency greater than approximately one Hertz in order to eliminate high background noise of the devices so that the rotating magnetometer and gradiometer sensor loops will pass through a plurality of positions in the magnetic field, and provide deducible oscillatory signals for describing vector and tensor components of the magnetic field, selectively rotating the container including the magnetometer and the gradiometer sensor loops about its second axis so as to reorient the container in another position in relation to the magnetic field being measured as the container including the magnetometer and gradiometer sensor loops all continue to rotate about the first axis, and analyzing the signals received from the magnetometer and the gradiometer sensor loops as the container continuously rotates about the first axis and selectively rotates about the second axis so as to measure and describe the magnetic field.

14. A method as in claim 13 wherein the pair of gradiometer sensor loops lie in the same plane.

15. A method as in claim 13 wherein the pair of gradiometer sensor loops lie in parallel spaced planes.

16. A method as in claim 13 wherein the step of selectively rotating is effected by rotating the container about its second axis at least 90°.

* * * * *